United States Patent
Rogers et al.

(10) Patent No.: US 11,521,828 B2
(45) Date of Patent: Dec. 6, 2022

(54) INDUCTIVELY COUPLED PLASMA SOURCE

(71) Applicant: Applied Materials, Inc., Santa Clara, CA (US)

(72) Inventors: James Rogers, Los Gatos, CA (US); John Poulose, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 91 days.

(21) Appl. No.: 15/727,998

(22) Filed: Oct. 9, 2017

(65) Prior Publication Data
US 2019/0108974 A1    Apr. 11, 2019

(51) Int. Cl.
*H01J 37/32* (2006.01)

(52) U.S. Cl.
CPC ............ *H01J 37/321* (2013.01); *H01J 37/32* (2013.01); *H01J 37/3211* (2013.01); *H01J 37/32183* (2013.01); *H01J 37/32449* (2013.01); *H01J 37/32522* (2013.01); *H01J 37/32651* (2013.01); *H01J 2237/026* (2013.01)

(58) Field of Classification Search
CPC .... H01J 37/321; H01J 37/32; H01J 37/32183; H01J 37/32449; H01J 37/32522; H01J 37/32651; H01J 2237/026; H01J 37/3211; H01J 37/32119
See application file for complete search history.

(56) References Cited

U.S. PATENT DOCUMENTS

| | | | |
|---|---|---|---|
| 5,731,565 A * | 3/1998 | Gates | H01J 37/321 156/345.48 |
| 5,753,044 A | 5/1998 | Hanawa et al. | |
| 5,772,832 A | 6/1998 | Collins et al. | |
| 5,777,289 A | 7/1998 | Hanawa et al. | |
| 5,919,382 A | 7/1999 | Qian et al. | |
| 6,036,877 A | 3/2000 | Collins et al. | |
| 6,036,878 A | 3/2000 | Collins | |
| 6,054,013 A | 4/2000 | Collins et al. | |

(Continued)

FOREIGN PATENT DOCUMENTS

| | | |
|---|---|---|
| CN | 104302084 A | 1/2015 |
| JP | 2005011799 A | 1/2005 |

(Continued)

OTHER PUBLICATIONS

International Search Report and Written Opinion dated Oct. 31, 2018 for PCT/US2018/041499.

(Continued)

*Primary Examiner* — Benjamin Kendall
(74) *Attorney, Agent, or Firm* — Patterson + Sheridan, LLP

(57) ABSTRACT

Disclosed herein is an apparatus for processing a substrate using an inductively coupled plasma source. An inductively coupled plasma source utilizes a power source, a shield member, and a coil coupled to the power source. In certain embodiments, the coils are arranged with a horizontal spiral grouping and a vertical extending helical grouping. The shield member, according to certain embodiments, utilizes a grounding member to function as a Faraday shield. The embodiments herein reduce parasitic losses and instabilities in the plasma created by the inductively coupled plasma in the substrate processing system.

23 Claims, 9 Drawing Sheets

(56) References Cited

U.S. PATENT DOCUMENTS

| | | | |
|---|---|---|---|
| 6,068,784 A | 5/2000 | Collins et al. | |
| 6,077,384 A | 6/2000 | Collins et al. | |
| 6,238,588 B1* | 5/2001 | Collins | H01L 21/31116 |
| | | | 216/68 |
| 6,248,250 B1 | 6/2001 | Hanawa et al. | |
| 6,270,617 B1 | 8/2001 | Yin et al. | |
| 6,297,468 B1 | 10/2001 | Qian et al. | |
| 6,308,654 B1* | 10/2001 | Schneider | H01J 37/321 |
| | | | 118/723 I |
| 6,369,348 B2 | 4/2002 | Qian et al. | |
| 6,369,349 B2 | 4/2002 | Qian et al. | |
| 6,373,022 B2 | 4/2002 | Qian et al. | |
| 6,409,933 B1 | 6/2002 | Holland et al. | |
| 6,414,648 B1 | 7/2002 | Holland et al. | |
| 6,444,084 B1 | 9/2002 | Collins | |
| 6,462,481 B1* | 10/2002 | Holland | H01J 37/321 |
| | | | 315/111.21 |
| 6,475,335 B1 | 11/2002 | Yin et al. | |
| 6,504,126 B2 | 1/2003 | Qian et al. | |
| 6,518,195 B1 | 2/2003 | Collins et al. | |
| 6,524,432 B1 | 2/2003 | Collins et al. | |
| 6,572,732 B2 | 6/2003 | Collins | |
| 6,623,596 B1 | 9/2003 | Collins et al. | |
| 6,685,798 B1 | 2/2004 | Holland et al. | |
| 6,694,915 B1 | 2/2004 | Holland et al. | |
| 6,818,140 B2 | 11/2004 | Ding | |
| 6,893,533 B2 | 5/2005 | Holland et al. | |
| 7,264,688 B1 | 9/2007 | Paterson et al. | |
| 7,645,357 B2 | 1/2010 | Paterson et al. | |
| 7,727,413 B2 | 6/2010 | Paterson et al. | |
| 7,780,864 B2 | 8/2010 | Paterson et al. | |
| 7,810,449 B2 | 10/2010 | Brcka et al. | |
| 7,905,982 B2* | 3/2011 | Howald | H01J 37/321 |
| | | | 156/345.48 |
| 8,419,893 B2 | 4/2013 | Willwerth et al. | |
| 8,933,628 B2 | 1/2015 | Banna et al. | |
| 2001/0022157 A1 | 9/2001 | Shin et al. | |
| 2002/0100557 A1 | 8/2002 | Li et al. | |
| 2002/0129903 A1* | 9/2002 | Davis | H01J 37/321 |
| | | | 156/345.48 |
| 2004/0255864 A1 | 12/2004 | Jeon | |
| 2007/0221622 A1* | 9/2007 | Kim | H01J 37/321 |
| | | | 216/68 |
| 2010/0243162 A1* | 9/2010 | Koshimizu | H01J 37/321 |
| | | | 156/345.28 |
| 2012/0152901 A1 | 6/2012 | Nagorny et al. | |
| 2012/0273130 A1* | 11/2012 | Drewery | H01J 37/32651 |
| | | | 156/345.3 |
| 2013/0105086 A1 | 5/2013 | Banna et al. | |
| 2013/0189848 A1 | 7/2013 | Willwerth et al. | |
| 2013/0220975 A1* | 8/2013 | Dhindsa | H01J 37/32568 |
| | | | 216/68 |
| 2013/0256271 A1 | 10/2013 | Panagopoulos et al. | |
| 2013/0278141 A1 | 10/2013 | Dorf et al. | |
| 2013/0278142 A1 | 10/2013 | Dorf et al. | |
| 2014/0367046 A1* | 12/2014 | Todorow | H01J 37/32532 |
| | | | 156/345.37 |
| 2015/0020969 A1 | 1/2015 | Sriraman et al. | |
| 2015/0191823 A1 | 7/2015 | Banna et al. | |
| 2016/0049279 A1 | 2/2016 | Suh | |
| 2016/0118284 A1 | 4/2016 | Iwai et al. | |
| 2016/0293382 A1 | 10/2016 | Sato et al. | |
| 2017/0200585 A1* | 7/2017 | Wang | H01J 37/321 |

FOREIGN PATENT DOCUMENTS

| | | |
|---|---|---|
| JP | 2012033960 A | 2/2012 |
| JP | 2016143616 A | 8/2016 |
| TW | 201528329 A | 7/2015 |
| TW | 201732079 A | 9/2017 |

OTHER PUBLICATIONS

Japanese Office Action issued to 2020-531430 dated Jan. 19, 2021.
Korean Office Action issued to 10-2020-7006226 dated May 18, 2021.
Korean Office Action issued to Application No. 10-2020-7006225 dated Oct. 21, 2021.
Japanese Office Action issued to Application No. 2020-531430 dated Dec. 7, 2022.
Chinese Office Action issued to Application No. 201880055802.9 dated Mar. 17, 2022.
Office Action from Taiwanese Patent Application No. 107131285 dated Aug. 31, 2022.

* cited by examiner

INDUCTIVELY COUPLED PLASMA SOURCE

BACKGROUND

Field

Embodiments of the present disclosure generally relate to an inductively coupled plasma source for processing substrates.

Description of the Related Art

Inductively coupled plasma (ICP) process chambers are common in microelectronics fabrication. In such a reactor, a plasma is formed in a gas therein by the use of an electric field within the gas tending to separate electrons from the gas atoms therein, creating a plasma of ions, free electrons, neutrals and radicals. In the ICP method of forming the plasma, the electric field is created by an A.C. current, for example R.F., flowing through one or more coils disposed outside of the processing chamber thereby inducing a current in the gas within the adjacent chamber gas volume. Power transfer efficiency, i.e., the amount of power passing through the coil which is effectively transferred into the gas to form the plasma, is a critical factor in the ICP process. ICP sources commonly couple to the gas in the chamber both capacitively and inductively, but capacitive coupling couples less efficiently, and for this and other reasons, is undesirable after the plasma is initiated or "ignited". The capacitive coupling enables ignition of the plasma and operations at a low power setting which creates a low density plasma (E-mode plasma). Once a plasma is established, the inductive coupling transitions the plasma to a higher density (H-mode plasma) minimizing the effects of the capacitive coupling.

One problem faced by ICP sources as described above is the E-mode plasma and the H-mode plasma have different load impendences to which the RF match network must tune. An RF match is used between the power source and the coil to "match" the effective coil circuit impedance to the plasma impedance.

Plasma instabilities form when the system switches between the two plasma modes. Additionally, low amplitude oscillations in impedance can cause instabilities using certain gas chemistries and wafer types. Sudden changes in impedance presented to the power source and coil circuit by plasma impedance changes causes the output power to the plasma to change. In turn, the plasma impedance changes due to the change in power delivered to the plasma which creates a positive feedback loop resulting in instabilities within the plasma-coil and power supply power coupling circuit.

SUMMARY

The present disclosure generally relates to an apparatus for processing a substrate. In one embodiment, the apparatus comprises a remote field power generator coupled to a coil and a shield member. The shield member comprises a plurality of radial spokes extending outwardly from a center and a plurality of slots between the spokes. The coil may be configured to include an inner coil and an outer coil where in the inner coil and outer coil each have a substantially horizontal portion.

In further embodiments, the apparatus comprises a remote field power generator coupled to a coil and a shield member. The shield member comprises a plurality of radial spokes of varying lengths extending inwardly from an outer diameter in a repeating pattern. The coil may be configured to include an inner coil and an outer coil where in the inner coil and outer coil each have a substantially horizontal portion.

In still further embodiments, the apparatus comprises a remote field power generator coupled to a coil and a shield member. The shield member comprises a plurality of semi-circular arcuate members which extend from a radial members in an alternating clockwise-counterclockwise arrangement. The coil may be configured to include an inner coil and an outer coil where in the inner coil and outer coil each have a substantially horizontal portion.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure generally relates to an apparatus for processing a substrate using an inductively coupled plasma source. The inductively coupled plasma source utilizes a power source, a shield member, and a coil coupled to the power source. In certain embodiments, the coils are arranged with a horizontal spiral grouping and a vertical extending helical grouping. The shield member, according to certain embodiments, utilizes a grounding member to function as a Faraday shield. The embodiments herein reduce parasitic losses and instabilities in the plasma in the substrate processing system.

Figure 1:
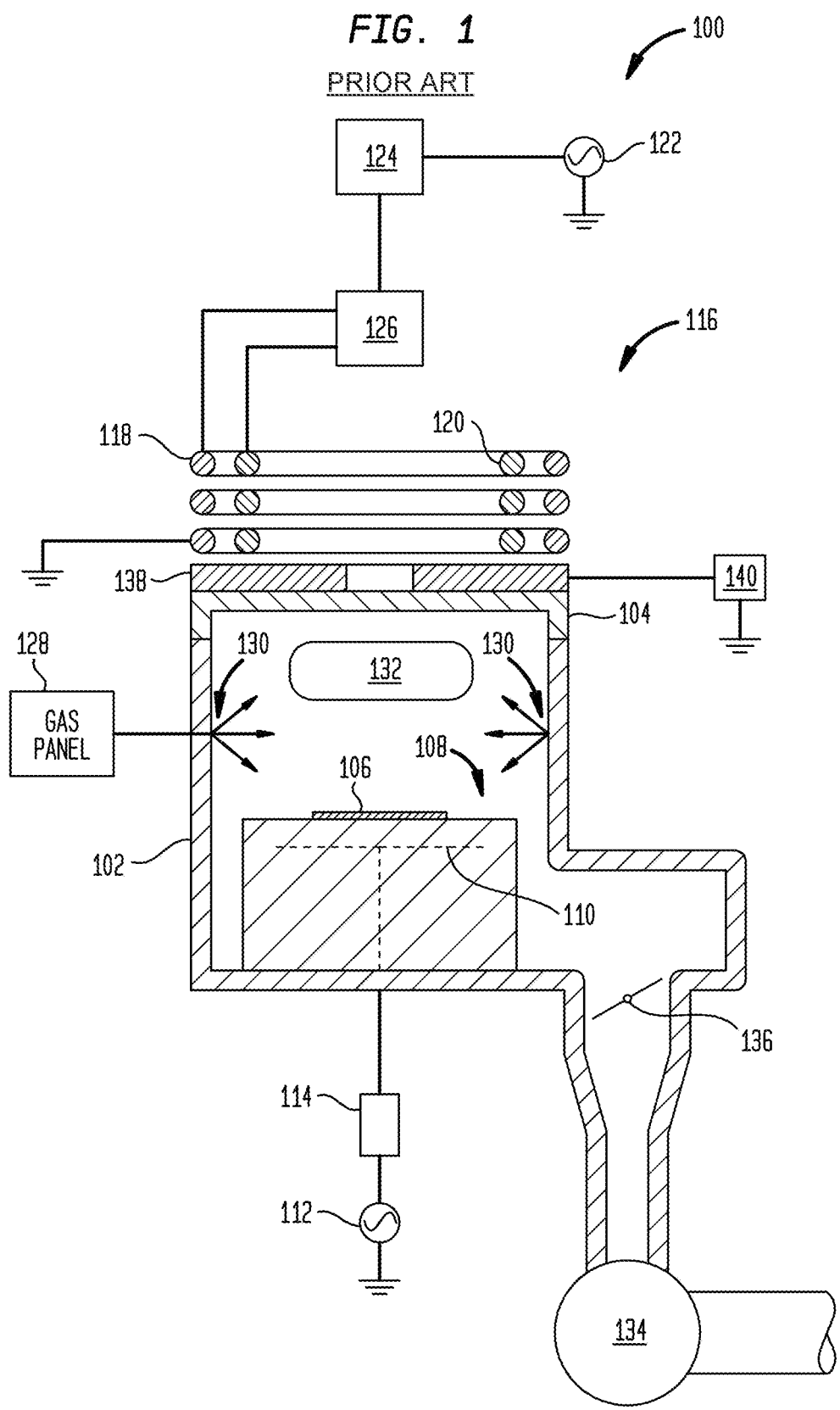
FIG. 1 is a schematic, cross-sectional view of an exemplary cross section of a prior art ICP system.

FIG. 1 is a schematic, cross sectional view of an exemplary process chamber 100. It is understood that the embodiments may be practiced in conjunction with any process system that utilizes a plasma to process a substrate. The chamber 100 includes a body 102 and a dielectric lid 104. A substrate 106 is disposable within the body 102 on a substrate support 108. Herein, the substrate support has an electrode 110 disposed therein coupled to a power source 112 through an RF matching network 114. A gas source 128 provides a process gas into the process chamber 100 through inlet ports 130. A vacuum pump 134 and a valve 136 control the pressure and outward flow of the gas into, and from, the processing chamber 100.

An inductively coupled source 116 is disposed adjacent to and over the lid 104. The inductively coupled source 116 comprises coils 118, 120 coupled to an RF power source 122. The RF power source 122 is further coupled to an RF match network 124. The coils 118, 120 may be independent coils powered separately, or dependent coils connected in a series arrangement. The inductively coupled source 116 creates a remote field within the processing region of the body 102 which ionizes the process gas introduced therein to form a plasma 132 therein. A resonant circuit 126 is disposed between the RF power source 122 and the coils 118, 120 to selectively deliver power to each coil to increase the control of the formation and maintenance of the plasma 132, as well as the relative intensity of the plasma across the face of the substrate 106 exposed to the plasma 132.

A shield 138 is disposed between the inductively coupled source 116 and the lid 104. A resistive heating element (not shown) is disposed within the shield 138 and coupled to a power source 140 thereof. The resistive heating element provides heat to control the temperature of the shield 138 and lid 104. The shield 138 is configured to be a Faraday shield to increase control of the RF field created by the inductively coupled source 116.

Figure 2:
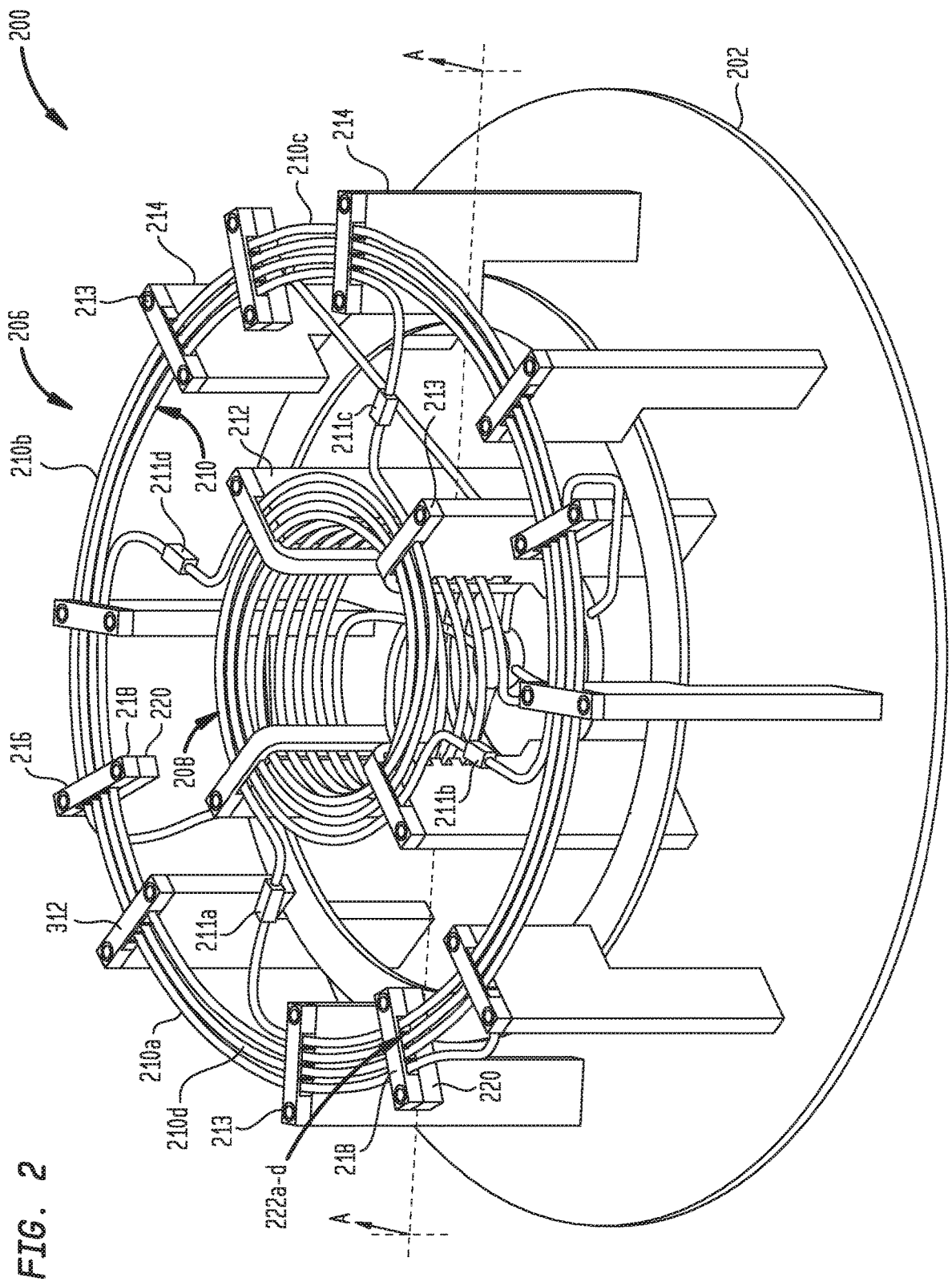
FIG. 2 is a perspective, schematic view of an inductively coupled source according to one embodiment.

FIG. 2 is a schematic, perspective view of an inductively coupled plasma source 200 according to one embodiment. In FIG. 2, for ease of understanding, the source 200 is shown upside-down from its orientation when used to form a plasma in a chamber. The inductively coupled plasma source 200, which may be similar to the inductively coupled source 116 of FIG. 1, has a top plate 202. The top plate 202 may be fabricated from metal, such as aluminum. Other materials such as quartz, or a dielectric material such as a dielectric ceramic, may also be used as the material of the top plate 202. The top plate 202 includes a plurality of vents (not shown) therethrough. The vents may be configured to allow air from a fan unit (not shown) to flow past the coils and then through the openings to create a flow path for air to cool the inductively coupled plasma source 200. The top plate 202 functions as the mounting surface for components of the inductively couples plasma source 200, and includes inner and outer stanchions 212, 214 to support the coils in a relatively fixed position spaced from the lid 104 of the process chamber 100.

A plurality of coils 206, here four coil, are coupled to the top plate 202 by inner and outer stanchions 212, 214. Each of the coils 206 include an inner coil portion 208 (inner coil portions 208a-d) and an outer coil portion 210 (outer coil portions 210a-d) connected together by a coil shunt portion 211 (coil shunt portions 211a-d). The inner coil portions 208a-d are supported by a plurality of, here four, inner stanchions 212 and the outer coil portions 210a-d are supported by a plurality of, here eight, outer stanchions 214. Each inner stanchion 212 and outer stanchion 214 hereof are configured of an electrical insulator, for example a polymer such as Delrin®. As described further herein, the stanchions 212, 214 support and fix the position of the coil portions 206, 208 with respect to the top plate 202. Note also, that in the configuration of FIG. 2 hereof, each inner coil portion 208a-d is supported by all four inner stanchions 212, but each outer coil portion 210a-d is supported by only seven of the eight outer stanchions 214, but each outer stanchion supports at least three, and in some cases, four outer coil portions 210a-d. Four free standing guides 216 are also provided, one of which is disposed between every other adjacent outer stanchion 214 lying along a generally circumferential path. The free standing guides 216 comprise an upper member 218 and a lower member 220. The upper member 218 and the lower member 220 are coupled together by a fastener, such as threaded fasteners 213 to form the free standing guide 216, but any means suitable for joining the members 218, 220 may be utilized. The upper member 218 has a generally comb shaped profile facing toward the top plate 202, and includes four recesses 222a-d extending inwardly the lower surface thereof, each recess 222 receiving an individual one of the outer coil portions 210a-d therein. The recesses 222a-d cooperate with the lower member to generally fix the radial location of each outer coil portion 210 and electrically isolate the different outer coil portions 210 from each other. Additionally, each free standing guide 216 is positioned circumferentially between two outer stations 214 at the location where a coil shunt portion 211 (coil shunt portions 211a-d) extends from the inner coil portion 208 to the outer coil portion 210 of each of the coils 206. Hence, the free standing guides 216 provide a fixed vertical support to vertically align the location where the outer coil portions 210a-d and the coil shunt portions 211a-d meet. Here, the free standing guides 216 are located ninety degrees apart around the circumferential path of the outer stations 214, where each of the coil shunt portions 211a-d extend between their respective inner coil portions 208a-d and outer coil portions 210a-d. In certain embodiments, the recesses 222a-d may be formed in the lower member 220 or in both the upper member 218 and lower member 220. The free standing guides 216 and stanchions 212, 210 are configured of a non-conductive material, such as a polymer or a ceramic.

Figure 3:
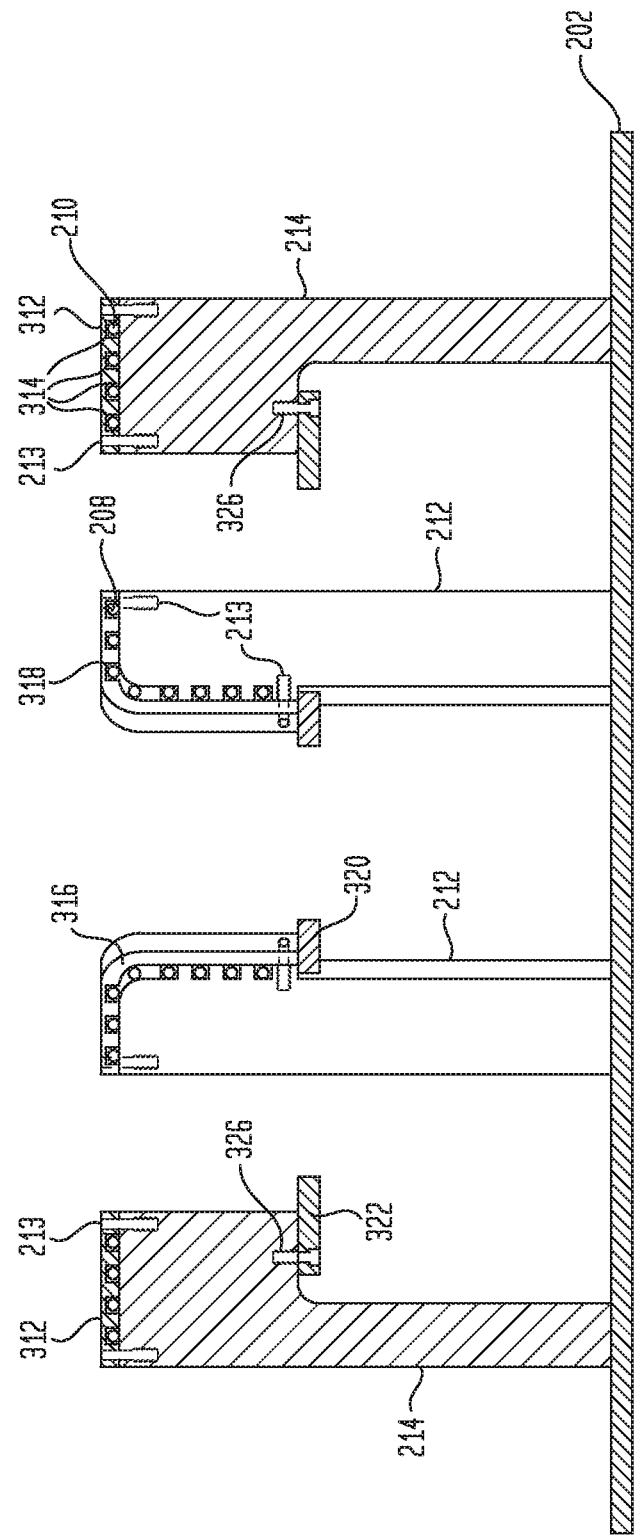
FIG. 3 is a schematic, cross-sectional view of the inductively coupled source of FIG. 2.

FIG. 3 is a cross section of the inductively coupled plasma source 200 viewed along Section A-A of FIG. 2, wherein portions of the coils and the inner and outer stanchions 208, 210 behind the A-A plane are not shown for ease of description. The top plate 202 is shown at the lower end of the Figure. The outer coil portions 210 are supported by the outer stanchions 214. The inner coil portions 208 are supported by the inner stanchions 212. It is understood that any number and configuration of coils 206, and resulting inner coil portions 208, outer coil portions 210, and coil shunt portions 211 may be utilized.

A keeper 312 is coupled to each of the outer stanchions 214 by threaded fasteners 213. However any means of coupling the stanchion 214 and the keeper 312, such as brazing or bonding, may be utilized. The keeper 312 contains one or more recesses 314 configured to cover a portion of the windings of the outer coil 210. A single outer coil portion 210 extends inwardly of each recess 314. The keeper 312 cooperates with the stanchion 214 to vertically fix the location of each outer coil portion and electrically isolate the different outer coil portions 210 from each other. In further embodiments, the recesses 314 may be formed in the stanchion 214 or in both the keeper 312 and the stanchion 214. The keepers 312 comprise a non-conductive material, such as a non-conductive polymer or a non-conductive ceramic.

A keeper 316 is likewise coupled to each inner stanchion 212 by threaded fasteners 213 (indicated in shadow). However any means of coupling the keeper 316 to the stanchion 212 may be utilized. Recesses 318 are formed within the keeper 316 and configured to receive one each go of the inner coil portions 208a-d therein. The keeper 316 cooperates with the stanchion 212 to vertically fix the inner coil portions 208a-d and electrically isolate them from each other. In certain embodiments, the keeper 316 may comprise more than one member such as a horizontal member and a vertical member. In still further embodiments, the recesses 318 may be formed in the stanchion 212 or in both the stanchion 212 and the keeper 316.

Rings 320, 322 are coupled to the inner stanchions 212 and outer stanchions 214, respectively. The inner ring 320 is connected to the inner stations 212 such that the outer diameter thereof abuts the side surface of each inner station 212, and thus helps set the diameter of the circumference about which the inner stanchions 212 are located. The outer ring 322 is connected to the outer stations 214 by fasteners, such as threaded fasteners 326, laying along a bolt circle, and thus the connection of the outer stations 214 thereto helps set the diameter of the circumference about which the outer stanchions 214 are located. The inner ring 320 and outer ring 322 may be configured of a polymer, such as Delrin®, or other insulating materials, or a combination thereof. Any material suitable for forming the annular rings may be utilized. The inner ring 320 and outer ring 322 aid to brace the stanchions 212, 214 coupled thereto. The rings 320, 322 are coupled to the stanchions 212, 214 by any suitable means such as bolting, brazing, or bonding.

Figure 4:
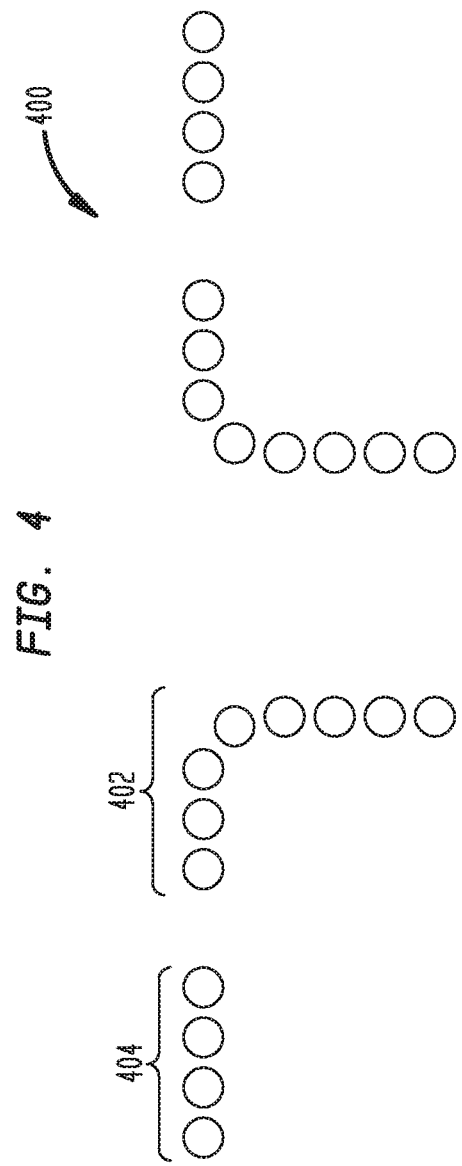
FIG. 4 is a cross-sectional view of a coil arrangement of one embodiment.

FIG. 4 is schematic representation of a coil arrangement of an inductively coupled source according to one embodiment. A coil 400, such as the coil 206 of FIG. 2, comprises inner coil portions 402 and outer coil portions 404. The outer coil portions 402 are configured as concentric spiral windings along a substantially horizontal plane. The inner coil portions 402 are together configured in two planes. A first portion of each of the inner coil portions 402 extend as a nested spiral in substantially horizontal plane. A second portion of each of the inner coil portions 402 are configured to wind, in a nested manner, along a substantially right cylindrical plane in the top plate 202 direction from the first portions. In FIG. 4, the outer coil 404 comprises four outer coil portions. The inner coil 402 comprises four inner coil portions. It is understood that other numbers of thus wound coil portions may be utilized. It is further understood that the groupings of coil windings (portions) may be a plurality of single continuous winding comprising both the inner and the outer portions as a single length of a conductor. In certain embodiments, the inner coil portions 402 and the outer coil portions 404 may be coupled to the same or different RF power generators, such as power source 122 of FIG. 1. Likewise, at the juncture of the inner and outer coil portions 402, 404, a capacitor, such as an adjustable capacitor, can be provided, wherein the inner and outer coils portions are connected thereto in parallel.

Figure 5:
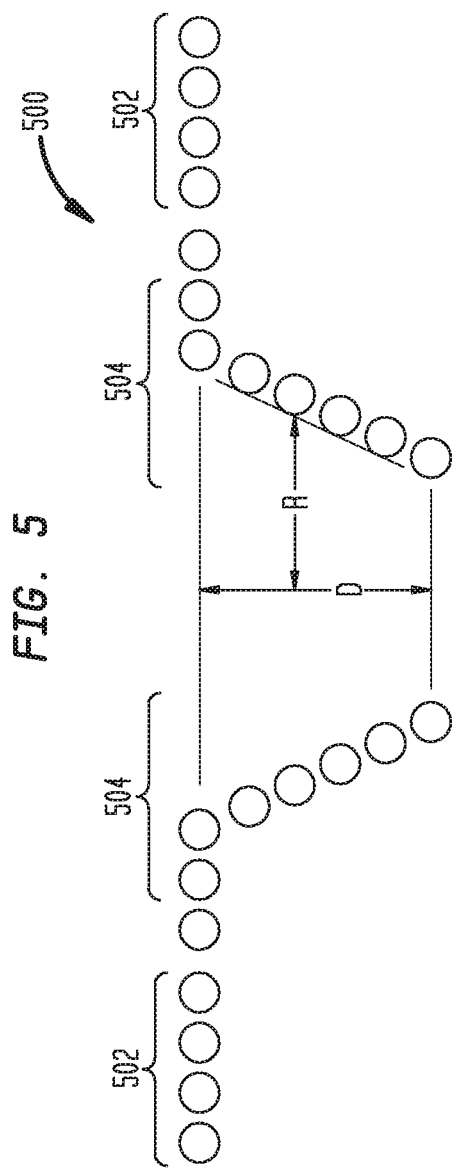
FIG. 5 is a cross-sectional view of a coil arrangement of one embodiment.

FIG. 5 is an additional schematic representative coil arrangement of an inductively coupled source according to one embodiment. This coil 500 comprises inner coil portions 504 and outer coil portions 502. The outer coil portions 502 are configured as nested concentric spiral windings in a substantially horizontal plane. The inner coil portions 504 are configured along two different geometric layouts. A first portion of the inner coil portions 504 are spirally nested along a substantially horizontal plane. A second portion of the inner coil portions 504 extends in the direction of the top plate 202 along an imaginary frustoconical surface around an axial center. The turn radius R of the second portions of the inner coil portions 504 reduces as the distance D along the axial center increases away from the horizontal first portions of the inner coil portions 504. Thus, a truncated cone of inner coil portions 504 is formed at the center of the inner coil 504.

It is understood that other numbers of thus wound coil portions may be utilized. It is further understood that the groupings of coil windings (portions) may be a plurality of single continuous winding comprising both the inner and the outer portions as a single length of a conductor. In certain embodiments, the inner coil portions 504 and the outer coil portions 502 may be coupled to the same or different RF power generators, such as power source 122 of FIG. 1. Likewise, at the juncture of the inner and outer coil portions 504, 502, a capacitor, such as an adjustable capacitor, can be provided, wherein the inner and outer coils portions are connected thereto in parallel.

The embodiments of FIG. 4 and FIG. 5 may be disposed adjacent a processing chamber lid, such as lid 104 of FIG. 1. In such a configuration, an airgap between the lid or a shield disposed on the lid is minimized thereby increasing the inductive coupling between the inductively coupled source and the plasma within the processing chamber. The horizontal coils of the embodiments of FIG. 4 and FIG. 5 increase the flux area wherethrough power is transferred from the coil to the plasma. The increase in flux area provides increased uniformity in the plasma within the processing volume due to the larger power distribution and increases the inductive coupling. By increasing the inductive coupling between the inductively coupled source and the plasma, parasitic power losses are reduced and the plasma uniformity is further increased by reducing the variations of impedance for the RF matching network.

Figure 6:
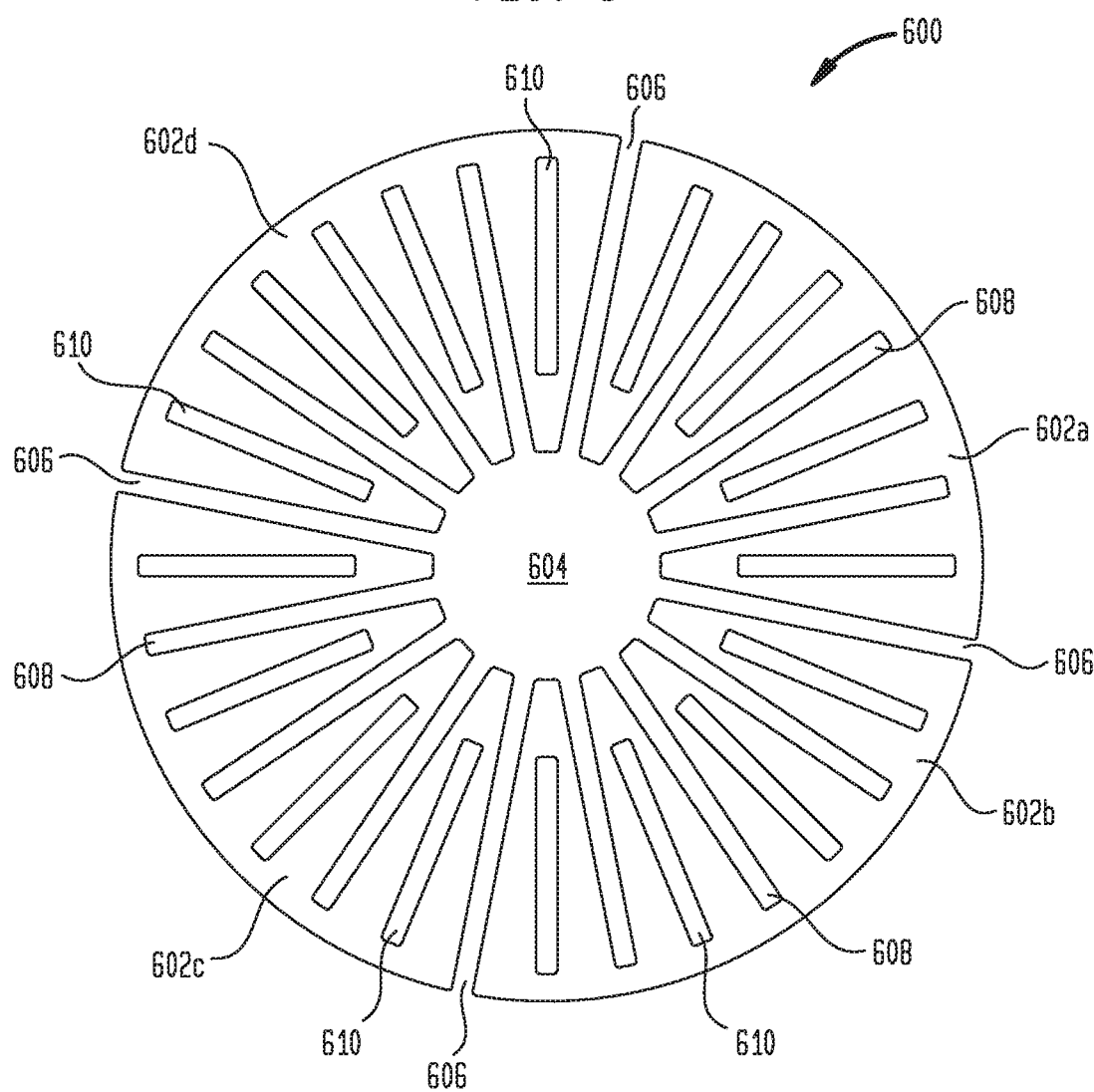
FIG. 6 is a plan view of a shield of one embodiment.
Figure 7:
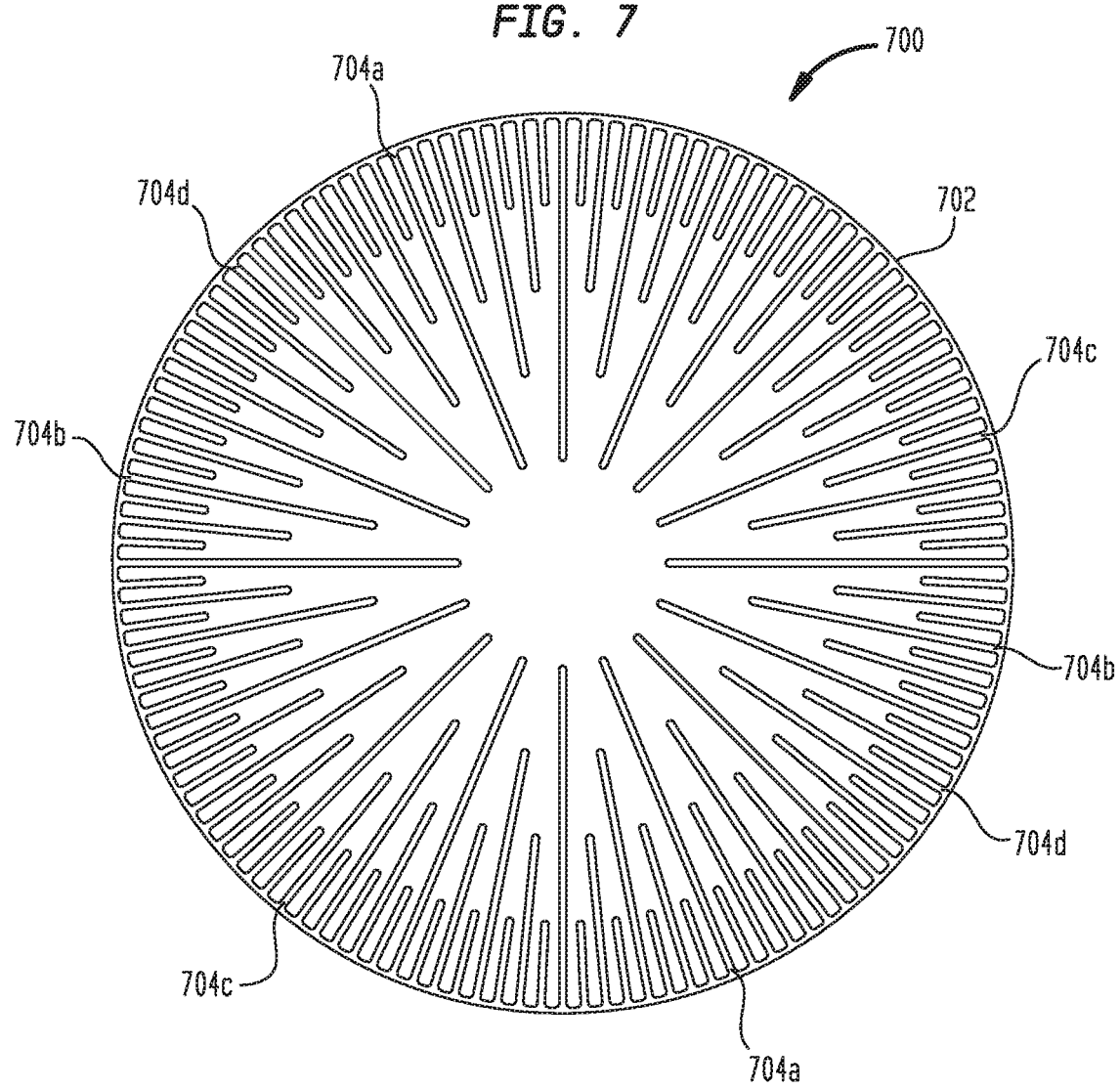
FIG. 7 is a plan view of a shield of one embodiment.
Figure 8:
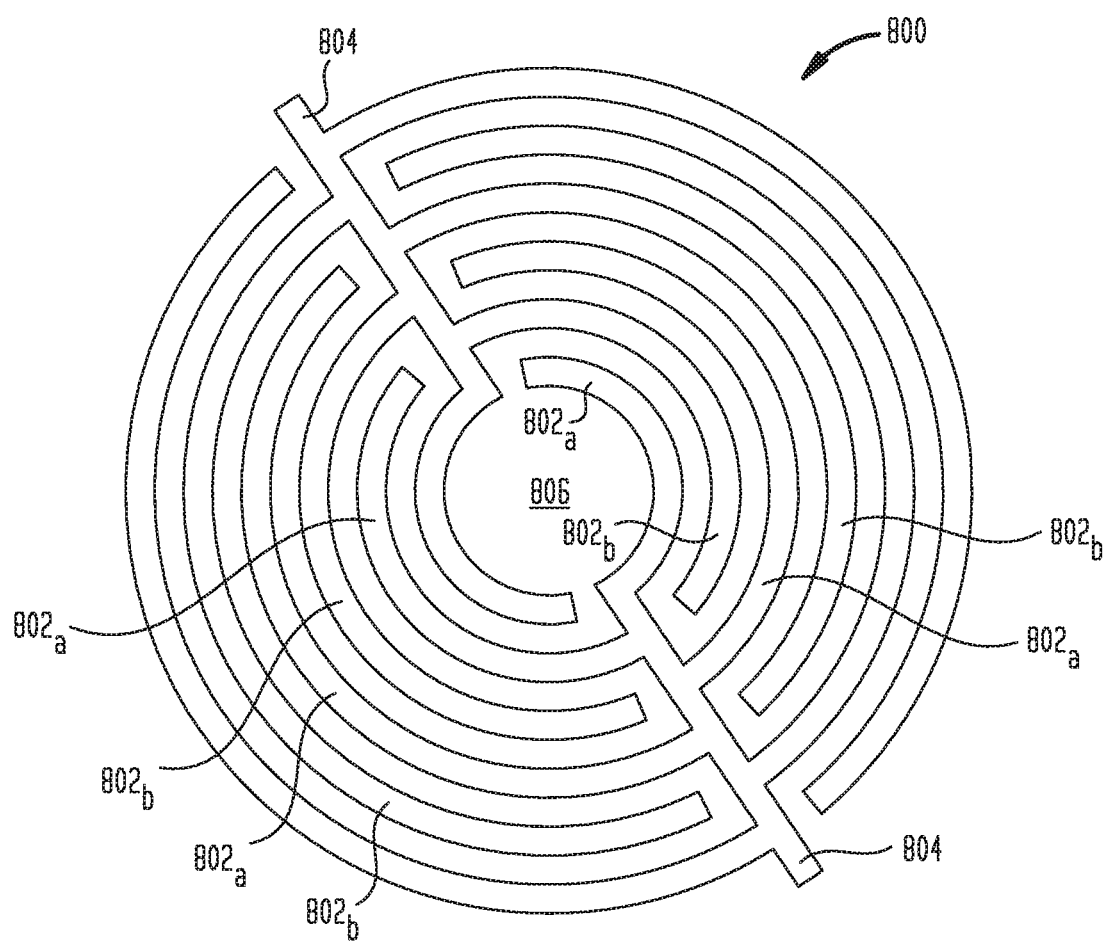
FIG. 8 is a plan view of a shield of one embodiment.

FIGS. 6-8 are plan views of various shields according to certain embodiments. The shield, like shield 138 of FIG. 1, is disposed between an inductively coupled source and a processing chamber. The shield influences the RF field to modify the plasma within the processing chamber. The shield is generally made from a metallic material, such as aluminum. In certain embodiments, the shield may be electrically grounded to form a Faraday shield. The shield may contain heating elements coupled to a power source and thereby simultaneously function as the lid heater. The heating elements may be used to control the temperature of the shield and the lid of the processing chamber. The shield may comprise segments, such as four or more segments, which are electrically connected to form the shield. The configuration of the shield, such as the size and width of slots or gaps therethrough, shield thickness, or number of segments, may be adjusted based on the desired level of influence to the RF.

FIG. 6 is a plan view of a shield of one embodiment. The shield 600 comprises discus shaped body formed of four identical segments 602a, 602b, 602c, 602d. An aperture 604 is formed at the center of the shield 600. Gaps 606 are formed at the interfaces of adjacent shield segments 602a-d and extend radially from the aperture 604 across the width of the shield 600. Spoke shaped slots 608 extend radially outwardly from the aperture 604 partially across the width of the shield 600. Slots 610 extend through the segments 602a-d and are disposed in between adjacent spoke shaped slots 608 and spoke shaped slots 608 and an adjacent gap 606. The slots 610 are contained within the chevron shaped sections formed by the spoke shape slots 608 and gaps 606, i.e., the heave opposed ends in the radial direction within the shield segments 602a-d.

FIG. 7 is a plan view of a shield of one embodiment. The shield 700 comprises a generally flat circular body 702 defining the outer circumference of the shield 700. A plurality of spokes 704a, 704b, 704c, 704d of varying lengths extend radially inward from the outer circumference of the body 702 of the shield 700 in a repeating pattern of first, second, third, and fourth lengths. Spokes 704*a* have a first length measured from the outer circumference towards the center of the shield 700. Spokes 704*b* have a length measured from the outer circumference towards the center that is less than the length of spokes 704*a*. Spokes 704*c* have a length measured from the outer circumference towards the center of the shield body 702 that is less than the length of spokes 704*b*. Spokes 704*d* have a length measured from the outer circumference of the shield body 702 toward the center that is less than the length of spokes 704*c*.

FIG. 8 is a plan view of a shield of another one embodiment. The shield 800 comprises radial members 804 and semi-circumferential arcuate members 802*a*, 802*b*. Radial members 804 extend radially from a center 806 of the shield 600. Arcuate members 802*a* extend form the radial members 804 in a clockwise direction at varying radii of curvature. Arcuate members 802*b* extend from the radial members 804 in a counter-clockwise direction at varying radii of curvature from the radial members 804. Arcuate members 802*a*, 802*b* are configured to interweave or nest in alternating fashion outwardly from the center 806.

Figure 9:
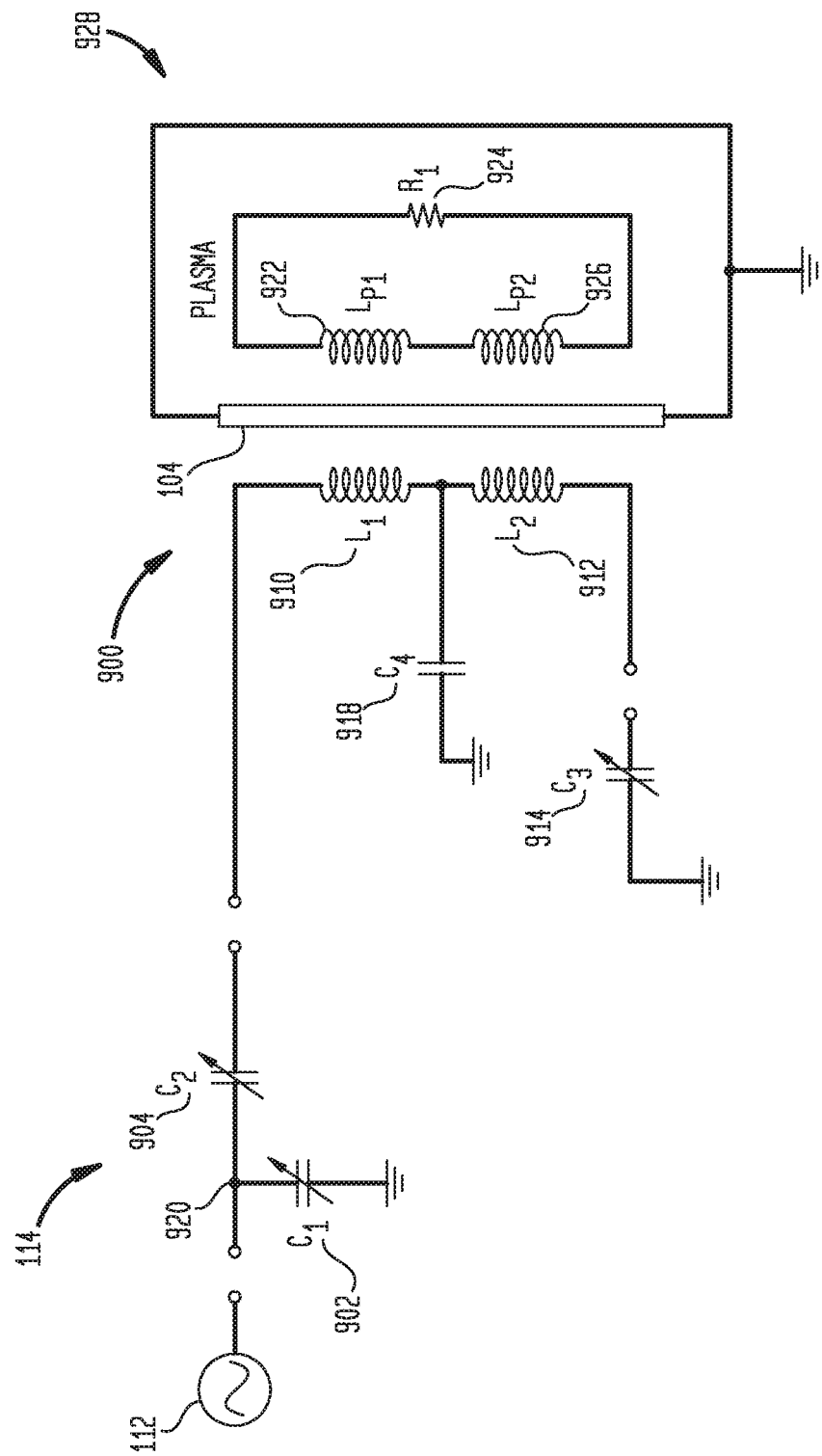
FIG. 9 is a circuit schematic of an inductively coupled source.

FIG. 9 is a circuit schematic of an exemplary matching network and source circuit, like the matching network 124 and inductively coupled source 116 of FIG. 1. In FIG. 9, a power source 112 is coupled to a match circuit 114. The match circuit 114 comprises a variable capacitor 902 and a variable capacitor 904 in two legs coupled at node 920. The leg comprising capacitor 904 is coupled to a source circuit 900. The source circuit 900 comprises a first inductor 910, which may be the outer coil portion such as one of 210*a-d* of FIG. 2 and FIG. 3, and a second inductor 912. The second inductor 912 is coupled in series to a variable capacitor 914. A fixed capacitor 918 is coupled to the circuit between the first inductor 910 and the second inductor 912. The inductor 912 may be the inner coil portion such as one of 208*a-d* of FIG. 2 and FIG. 3. The inductors 910, 912 inductively couple power to the process chamber 928 though the chamber lid 104 and electromagnetically communicate with a plasma disposed therein. The plasma has a first inductance 922 which is coupled to the first inductor 910, a second inductance 926 which is coupled to the second inductor 912, and a resistance 924.

The circuit of FIG. 9 functions to "match" the source power impedance to the impedance of the load in order to maximize power transfer between the source and the load. Further, by utilizing variable capacitors 902, 904, and 914, the power can be controlled individually to an inner coil segment (inductor 912) and an outer coil segment (inductor 910). The control of power to the individual coil segments increases the uniformity of the plasma formed within the process chamber. In certain embodiments, the power to the inner coil and outer coil may be in-phase. In other embodiments, the power to the inner coil and outer coil may be out-of-phase. The circuit of FIG. 9 may be practiced with the embodiments described above. It is further understood that the circuit of FIG. 9 may be practiced with any coil source wherein increased control of the power to inductors is advantageous.

The embodiments described herein advantageously create a more uniform plasma field in a plasma processing system. Increasing the inductively coupling and reducing the capacitive coupling lessens the variation in impedance matched by the match network, which in turn reduces the variation in the power transferred to the plasma. Further, power transfer efficiency is increased by reducing parasitic losses with the system.

While the foregoing is directed to embodiments of the present disclosure, other and further embodiments of the disclosure may be devised without departing from the basic scope thereof, and the scope thereof is determined by the claims that follow.

What is claimed is:

1. An apparatus for processing a substrate, comprising:
one or more conductors configured to be coupled to a remote field power generator, wherein each of the one or more conductors comprises an inner coil serially coupled to an outer coil by a shunt, wherein the outer coil is disposed in a first plane, wherein a first segment of the inner coil comprising a first set of coil portions is coplanar with and coupled to the outer coil;
a shield member configured to couple to ground and disposed parallel with the first plane, the shield member comprising a plurality of members disposed between a central region of the shield member and an outer diameter of the shield member;
a plurality of inner stanchions supporting the inner coil of each of the one or more conductors above the shield member; and
a plurality of outer stanchions supporting the outer coil of each of the one or more conductors above the shield member, wherein
the inner coil has a second segment serially coupled to the first segment, wherein the second segment includes a second set of coil portions, the second segment configured in a vertical-helical arrangement, wherein the vertical-helical arrangement of the second segment terminates at an innermost diameter of the inner coil that defines an inside diameter of the one or more conductors,
each of the second set of coil portions having a turn diameter that reduces as a distance increases in a direction away from the outer coil.

2. The apparatus of claim 1, wherein the plurality of members comprises a plurality of spokes radially extending from the central region and a plurality of slots disposed between the spokes.

3. The apparatus of claim 1, wherein the one or more conductors comprises four conductors.

4. The apparatus of claim 1, wherein
the shield member further comprises four segments coupled to form the shield member, and
the four segments are each separated from one another by a gap.

5. The apparatus of claim 1, wherein the first set of coil portions include multiple turns.

6. The apparatus of claim 1, wherein:
the plurality of members comprises a plurality of spokes extending radially inward from the outer diameter of the shield member.

7. The apparatus of claim 6, wherein the shield member further comprises a heating element.

8. The apparatus of claim 6, wherein the shield member is a grounded shield member.

9. The apparatus of claim 1, wherein:
the plurality of members comprises a plurality of nested semicircular arcuate members extending from a radial member partially around a center aperture in an alternating clockwise-counterclockwise arrangement.

10. The apparatus of claim 1, wherein each coil portion of the second set of coil portions is disposed in different vertical positions.

11. The apparatus of claim 1, wherein the first segment includes two or more coil portions in the first set of coil portions.

12. An apparatus for processing a substrate, comprising:
one or more conductors configured to couple to a remote field power generator, wherein each of the one or more conductors comprises an inner coil serially coupled to an outer coil by a shunt, wherein the inner coil comprises a first segment serially coupled to a second segment, wherein the outer coil is disposed in a first plane, wherein the first segment of the inner coil comprising a first set of coil portions comprises multiple turns, the first set of coil portions is coplanar with the outer coil, the second segment extending at an angle from the first segment relative to the first plane and separated from the outer coil by the first segment, wherein the second segment terminates at an innermost diameter of the inner coil that defines an inside diameter of the one or more conductors;
a shield member configured to couple to ground and disposed parallel with the first plane, the shield member comprising a plurality of members disposed between a central region of the shield member and an outer diameter of the shield member;
a plurality of inner stanchions supporting the inner coil of each of the one or more conductors above the shield member;
a plurality of outer stanchions supporting at least one of the one or more conductors of the outer coil above the shield member, wherein:
at least one of the outer stanchions does not support at least a portion of one of the one or more conductors; and
one or more free standing guides, each of the one or more free standing guides disposed between every other adjacent outer stanchion, wherein each of the one or more free standing guides support the outer coil in the first plane.

13. The apparatus of claim 12, wherein:
the plurality of inner stanchions include four inner stanchions, and
the plurality of outer stanchions include eight outer stanchions.

14. The apparatus of claim 13, wherein:
seven of the plurality of outer stanchions support more than one of the one or more conductors of the outer coil, and
an eighth outer stanchion does not support at least a portion of the at least one of the one or more conductors.

15. The apparatus of claim 13, wherein each of the plurality of outer stanchions supports three or four of the one or more conductors.

16. The apparatus of claim 12, wherein a diameter of the second segment at an end farthest from the first segment is less than the diameter of the second segment at an end closest to the first segment.

17. The apparatus of claim 12, wherein the first segment includes two or more coil portions in the first set of coil portions.

18. An apparatus for processing a substrate, comprising:
one or more conductors configured to couple to a remote field power generator, each of the one or more of conductors comprises an inner coil serially coupled to an outer coil by a shunt, wherein the inner coil comprises a first segment serially coupled to a second segment, the first segment configured in a first concentric planar arrangement in a first plane, the second segment extending from the first segment below and nonparallel to the first plane and separated from the outer coil by the first segment, wherein the second segment terminates at an innermost diameter of the inner coil that defines an inside diameter of the one or more conductors, wherein the outer coil is disposed in the first plane coplanar with the first segment of the inner coil, the outer coil serially coupled to the first segment by the shunt;
a plurality of inner stanchions supporting the inner coil of each of the one or more conductors; and
a plurality of outer stanchions supporting the outer coil of each of the one or more conductors.

19. The apparatus of claim 18, further comprising:
one or more free standing guides, each of the one or more free standing guides disposed between every other adjacent outer stanchion, each of the one or more free standing guides lying along a circumferential path, wherein each of the one or more free standing guides support the outer coil in the first plane.

20. The apparatus of claim 19, wherein each free standing guide comprises an upper member and a lower member, and wherein each upper member and each lower member are coupled by a threaded fastener.

21. The apparatus of claim 19, wherein each free standing guide comprises an upper member and a lower member, and wherein each upper member comprises one or more upper recesses extending inwardly, each recess receiving an individual outer coil therein.

22. The apparatus of claim 21, wherein each lower member comprises one or more lower recesses.

23. The apparatus of claim 18, wherein the second segment is configured in a vertical-helical arrangement.

* * * * *